(12) United States Patent
Bettencourt et al.

(10) Patent No.: US 8,854,140 B2
(45) Date of Patent: Oct. 7, 2014

(54) CURRENT MIRROR WITH SATURATED SEMICONDUCTOR RESISTOR

(71) Applicant: Raytheon Company, Waltham, MA (US)

(72) Inventors: John P. Bettencourt, Danvers, MA (US); Frank J. DeCaro, Nashua, NH (US); John C. Tremblay, Lancaster, MA (US)

(73) Assignee: Raytheon Company, Waltham, MA (US)

(*) Notice: Subject to any disclaimer, the term of this patent is extended or adjusted under 35 U.S.C. 154(b) by 57 days.

(21) Appl. No.: 13/719,619

(22) Filed: Dec. 19, 2012

(65) Prior Publication Data

US 2014/0167859 A1    Jun. 19, 2014

(51) Int. Cl.
  *H03F 3/04* (2006.01)
  *H03F 1/00* (2006.01)
  *G05F 3/26* (2006.01)

(52) U.S. Cl.
  CPC ... *G05F 3/26* (2013.01); *H03F 1/00* (2013.01)
  USPC .......................................... 330/288; 323/315

(58) Field of Classification Search
  USPC .................................. 330/288; 323/315, 316
  See application file for complete search history.

(56) References Cited

U.S. PATENT DOCUMENTS

| | | | |
|---|---|---|---|
| 6,456,163 B1 * | 9/2002 | Luo et al. | 330/288 |
| 6,750,720 B1 * | 6/2004 | Mori et al. | 330/288 |
| 7,064,614 B2 * | 6/2006 | Feng et al. | 330/296 |
| 7,714,659 B2 * | 5/2010 | Leitner | 330/296 |
| 7,898,335 B2 * | 3/2011 | Teraguchi | 330/285 |
| 2005/0184808 A1 | 8/2005 | Krutko et al. | |

FOREIGN PATENT DOCUMENTS

JP    09-246882    9/1997

OTHER PUBLICATIONS

Notification of Transmittal of The International Search Report and The Written Opinion of the International Searching Authority, or the Declaration, PCT/US2013/070717, Mar. 27, 2014, 1 page.
International Search Report, PCT/US2013/070717, Mar. 27, 2014, 4 pages.
Written Opinion of the International Searching Authority, PCT/US2013/070717, Mar. 27, 2014, 9 pages.
Juhno Beak, Michael S. Shur, Kang W. Lee, Tho Vu, Current-Voltage Characteristics of Ungated GaAs FET's, IEEE, vol. ED-32, No. 11, Nov. 1985, 5 pages.
Electronic Letters 26, Oct. 26, 1990, No. 21, Stevenage, Herts, GB, 3 pages.
Chen-Ping Lee, Bryant M. Welch, Ricardo Zucca, Saturated Resistor Load for GaAs Integrated Circuits, IEEE, vol. MIT-30, No. 7, Jul. 1982, 7 pages.

* cited by examiner

*Primary Examiner* — Henry Choe
(74) *Attorney, Agent, or Firm* — Daly, Crowley, Mofford & Durkee, LLP

(57) ABSTRACT

A current mirror circuit having formed in a semiconductor: a pair of transistors arranged to produce an output current through an output one of the transistors proportional to a reference current fed to an input one of the pair of transistors; a resistor comprising a pair of spaced electrodes in ohmic contact with the semiconductor, one of such pair of electrodes of the resistor being coupled to the input one of the pair of transistors; and circuitry for producing a voltage across the pair of electrodes of the resistor, such circuitry placing the resistor into saturation producing current through a region in the semiconductor between the pair of spaced ohmic contacts, such produced current being fed to the input one of the transistors as the reference current for the current mirror.

9 Claims, 5 Drawing Sheets

CURRENT MIRROR WITH SATURATED SEMICONDUCTOR RESISTOR

TECHNICAL FIELD

This disclosure relates generally to current mirrors and more particularly to current mirrors having a saturated semiconductor resistor reference for bias control of Radio Frequency (RF) transistor amplifiers.

BACKGROUND AND SUMMARY

As is known in the art, an important requirement for any Radio Frequency (RF) Transistor Amplifier Design is the establishment of stable DC operating conditions. Such conditions affect many of the amplifier performance characteristics, e.g., gain, frequency response, noise and efficiency. Also the DC operating conditions, e.g., quiescent drain current, must be predictable and invariant with respect to temperature, power supply and process variations. Setting this quiescent drain current (Id) for a Field Effect Transistor (FET) type amplifier, shown in FIG. 1, is usually accomplished by adjusting the DC voltage Vg supplied to the gate of the transistor (Q1). Although in principle Vg can be determined readily from the Id versus Vg transfer characteristic of a typical device, inherent sensitivities of the FET characteristics to fabrication process and temperature preclude use of a fixed Vg.

As is also known in the art, a commonly used DC biasing element in analog circuit design is a current mirror such as that described in a book by Paul R. Gray and Robert G. Meyer, entitled Analysis and Design of Analog Integrated Circuits, $3^{rd}$ ed., New York: Wiley, 1993. FIG. 2 is a schematic representation of a current mirror for D-mode GaAs MESFET operational amplifiers demonstrated by Scheinberg, see N Scheinberg, Design of high speed operational amplifiers with GaAs MESFETs, procs 1987 IEEE ISCAS (Philadelphia), May 1987, pp 193-198 and C. Tamazou and D. Haigh, "Gallium Arsenide Analog Integrated Circuit Design Techniques," Chapter 8 in "Analogue IC design: the current-mode approach", Edited by C. Toumazou, F. J. Lidgey & D. G. Haigh. London: Peter Peregrinus Ltd. 1990. By appropriately sizing; i.e., widths of the transistors Q1 and Q2, the current mirror allows one to set very stable and controllable current ID2 in the main circuit transistor Q2. Here, the current ID2 "mirrors" (i.e., is proportional to) the reference current Iref. An important element to the operation of the current mirror is availability of a stable reference current, Iref. This relationship of the currents is shown by the following equation where.

$ID2 = (\text{Width } Q2/\text{Width } Q1)Iref$

Note that as long as Q1 and Q2 are fabricated in proximity to each other on the same chip, the relationship between the currents will be maintained regardless of process variation, most notably voltage threshold (Vt) variations.

The above circuit in FIG. 2 can be easily Implemented for controlling drain current in a high efficiency, high powered RF amplifier. FIG. 3 shows a simplified schematic implementation with appropriate inductor and capacitors connected to what would be a RF amplifier FET(s) Q2. A necessity for high power and high efficiency RF amplifiers is that the FET source potentials need to be tied directly to ground reference, also depicted in FIG. 3 by showing Vss tied to ground potential. Also note that Vss1 is more negative than ground potential where the drains of Q1, Q2 and Q3 are more positive than ground potential.

In the absence of a bias circuit that compensates for process variations, some means for adjusting the gate voltage Vg preferably on a per amplifier basis has to be implemented to ensure that quiescent drain current Id is set near the nominal target value. Typical implementations include: supplying externally an individual Vg voltage to each amplifier; adding a resistor ladder network on chip to generate several candidate Vg voltages from a fixed, supply voltage; screening and dividing parts into several Vg bins. However, these options require some level of testing to determine first how each part or a group of parts has to be biased. Then assembly is tailored to that particular part or group of parts. These steps add significant time and cost to the product. One of the goals of a DC bias circuit is to circumvent the need for these Vg bins. Examples of patents for these types of circuits are: U.S. Pat. Nos. 5,889,429; 6,304,130; 6,114,901; 5,793,194; 4,896,121; and 7,928,804.

As is also knows in the art, high performance RF amplifiers are typically fabricated in III-V FET technology. GaAs or GaN for example. In contrast to the silicon-based technologies (CMOS), "biasing" current mirrors are not common in III-V FET amplifiers due to the absence of monolithic high precision constant current sources to generate Iref. CMOS, for example, can rely on the high level of control over the technology threshold voltage ($V_t$) for generating these references.

The inventors have recognized that for III-V FET technology, one can utilize a semiconductor resistor operated (i.e., placed) in saturation (i.e., in a region where the current through the resistor is substantially constant with variations in the voltage across the resistor) to generate Iref as shown in FIG. 3. A saturated resistor has similar current—voltage behavior as a FET when the resistor operates in saturation and thereby enables the semiconductor resistor to operate as a constant current source; i.e., constant current over varying supply voltage. The advantage of the saturated resistor is it is less prone to process variations than FET based constant current sources, making it an ideal monolithic current reference. The inventors have recognized that formation of the Schottky Gate is the primary reason the FET current reference is prone to more variability than the resistor reference, see Chien-Ping Lee, Bryant M. Welch, and Ricardo Zucca, Saturated Resistor Load for GaAs Integrated Circuits, IEEE Transactions on Microwave Theory and Technique, Vol. MTT-30, No. 7, July 1982. FIG. 4 is a chart depicting the current-voltage relationship of a semiconductor resistor operated in saturation. It is noted that, as a function of voltage across the resistor, the resistor passes from a linear region where the current through the resistor is directly proportional to the voltage across the resistor to a transition region to the saturation region where the current through the resistor is substantially constant with variations in the voltage across the resistor In accordance with the present disclosure, a current mirror circuit is provided having formed in a semiconductor: a pair of transistors arranged to produce an output current through an output one of the transistors proportional to a reference current fed to an input one of the pair of transistors; a resistor comprising a pair of spaced electrodes in ohmic contact with the semiconductor, one of such pair of electrodes of the resistor being coupled to the input one of the pair of transistors; and circuitry for producing a voltage across the pair of electrodes of the resistor to place the resistor into saturation producing a current through a region in the semiconductor between the pair of spaced ohmic contacts, such produced current being fed to the input one of the transistors as the reference current for the current mirror.

In one embodiment, an amplifier circuit is provided having formed in a semiconductor current mirror circuitry comprising: a field effect transistor having: a gate electrode; a source electrode and a drain electrode, the gate electrode being coupled to a negative potential; the source electrode being coupled to ground potential; and the gate electrode being coupled to a variable input signal, the input signal being amplified by the transistor to produce an amplified signal at the drain electrode; wherein the current mirror produces current in the drain electrode proportional to a reference current produced by the current mirror, the current mirror comprising: a resistor comprising a pair of spaced electrodes in ohmic contact with the semiconductor; and circuitry for producing a voltage across the pair of electrodes of the resistor, such circuitry placing the resistor into saturation, such produced current being fed to drain electrode to provide the reference current.

With such an arrangement, because the resistor is a two terminal device, the use of a three terminal FET based constant current source having Schottky contact gate formation has been eliminated along with the process variability associated with such Schottky gate formation. Thus, the saturated resistor constant current source according to the disclosure has less process variation than a three terminal FET based constant current source.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 5:
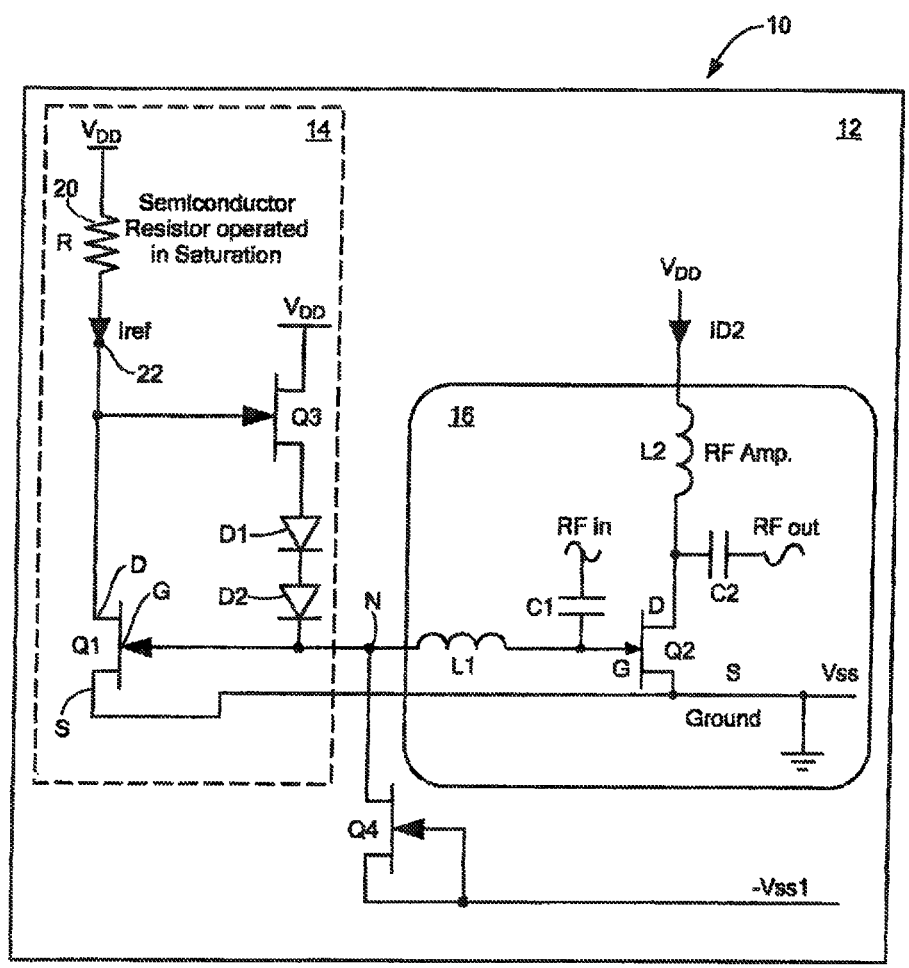
FIG. 5 is a schematic diagram of an RF amplifier wherein a resistor operating in saturation provides a reference current in a current mirror portion of the amplifier according to the disclosure.

Referring now to FIG. 5, an amplifier circuit 10 is shown. The amplifier circuit 10 is formed on a semiconductor 12, here, for example, a III-V semiconductor such as, for example GaAs. More particularly, the amplifier circuit 10 includes a positive non-inverting current mirror 14 comprising: a transistor FET Q1 where the drain is fed by a reference current Iref generated by a resistor R, such resistor R being in saturation. It is noted that FET Q1 is also placed into saturation so that the current between its source (S) and drain (D) is substantially constant with variations in the voltage across its source (S) and drain (D). A FET Q2 is provided having its gate electrode (G) connected to the gate electrode of FET Q1, where the current ID2 through the drain electrode of transistor FET Q2, can be regulated by the value Iref. It is noted that FET Q1 and FET Q2 are both placed into saturation along with the saturation of resistor R. Thus, for a VDD required to place FET Q1 in saturation, the size of the resistor R, i.e., the surface length and width of resistor R, must be selected so that with this VDD the resistor R will also be placed in saturation.

More particularly, the drain electrode (D) of FET Q1 is coupled to its gate electrode (G) through a follower network comprised of FET Q3 and a network comprising a plurality of serially coupled diodes, here, for example, a pair of serially connected diodes D1 and D2, and another serial element, here a transistor load Q4, as shown. The source electrode of FET Q1 is coupled to ground potential, as indicated. The gate electrode (G) of FET Q1, with above follower network (i.e., follower Q3, diodes and Q4) produces an output at node N which is fed to the gate electrode of a depletion-mode FET Q2 which serves as an RF amplifier. More particularly, the gate electrode (G) of FET Q2 is fed an input RF signal RFin. It is noted that since the FET Q2 is here a depletion-mode FET, its gate electrode is typically DC biased at a potential more negative than ground potential, here the gate of FET Q2 is led to −Vss1 through a transistor load FET Q4, as shown.

Still more particularly, FET Q1 has its drain electrode (D) coupled to a +Vdd supply voltage through the resistor R (which, as noted above, is in saturation) and to the gate electrode (G) of FET Q3, as shown. The drain electrode of FET Q3 is also connected to +Vdd. The gate electrode G of FET Q1 is connected to the source electrode of FET Q3 through the diodes D1 and D2, as shown. The source electrode (S) of FET Q1 is connected to Vss, here ground potential. The gate electrode of FET Q1 is also connected to the gate electrode of FET Q2 through an RF blocking inductor L1 and to −Vss1 through FET Q4 connected as a current source, as shown. The gate electrode G of FET Q2 is also RF coupled to an RF input signal, RFin through a DC blocking capacitor C1, as indicated. The source electrode of FET Q2 is connected to Vss, here, as noted above, ground potential. The drain electrode of FET Q2 is coupled to Vdd through an RF blocking inductor L2 and is also coupled to the output RFout through DC blocking capacitor C2, as indicated. Here, for example, the FETs are depletion-mode FETs (D-FETS).

Figure 1:
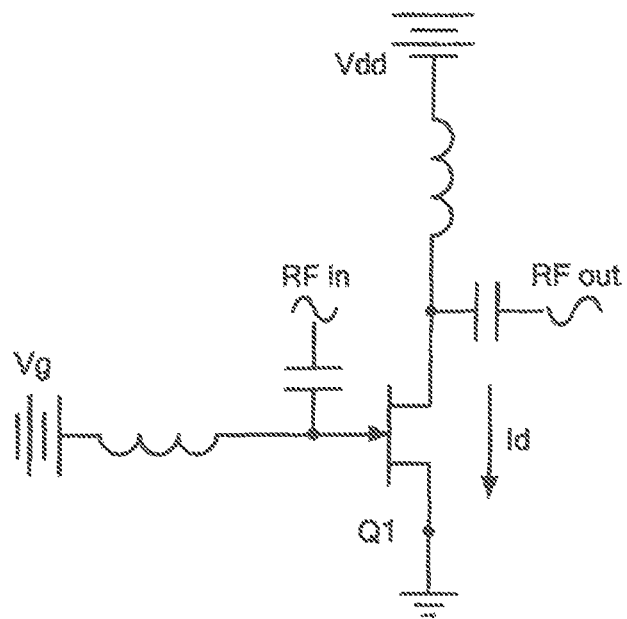
FIG. 1 is a schematic diagram of an RF Transistor Amplifier according to the PRIOR ART.
Figure 2:
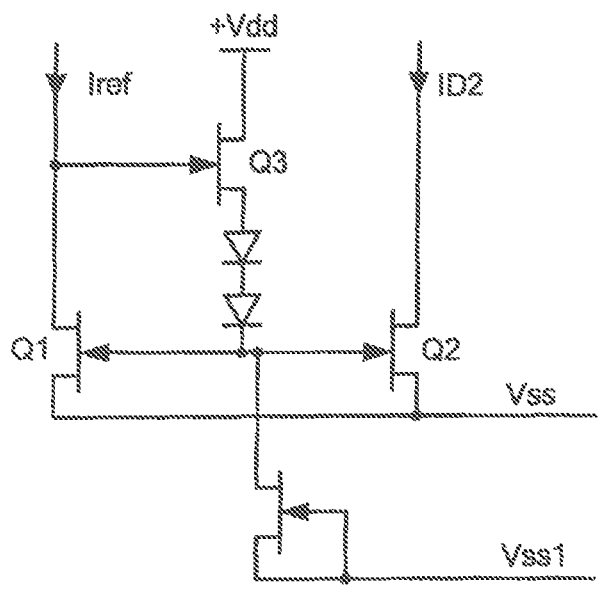
FIG. 2 is a schematic representation of a current mirror for D-mode GaAs MESFET operational amplifiers according to the PRIOR ART.
Figure 3:
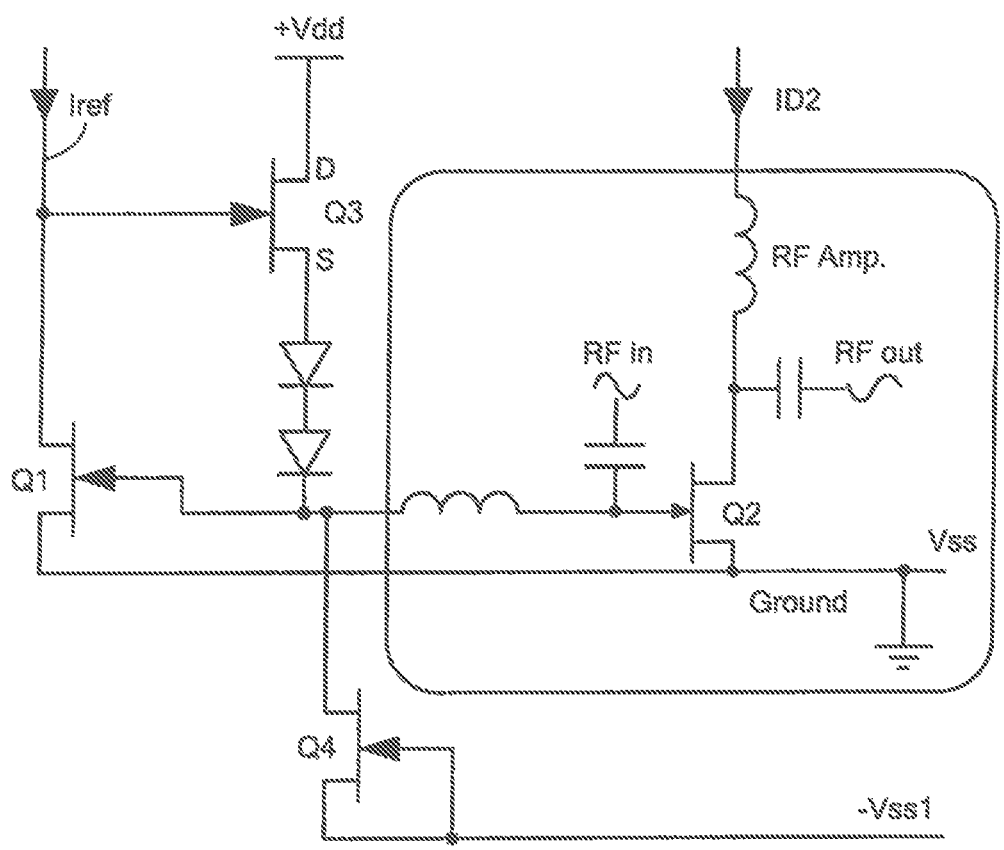
FIG. 3 is a more complete schematic diagram of the current mirror of FIG. 2 wherein one of the transistors in the current mirror is used as an amplifier according to the PRIOR ART.
Figure 4:
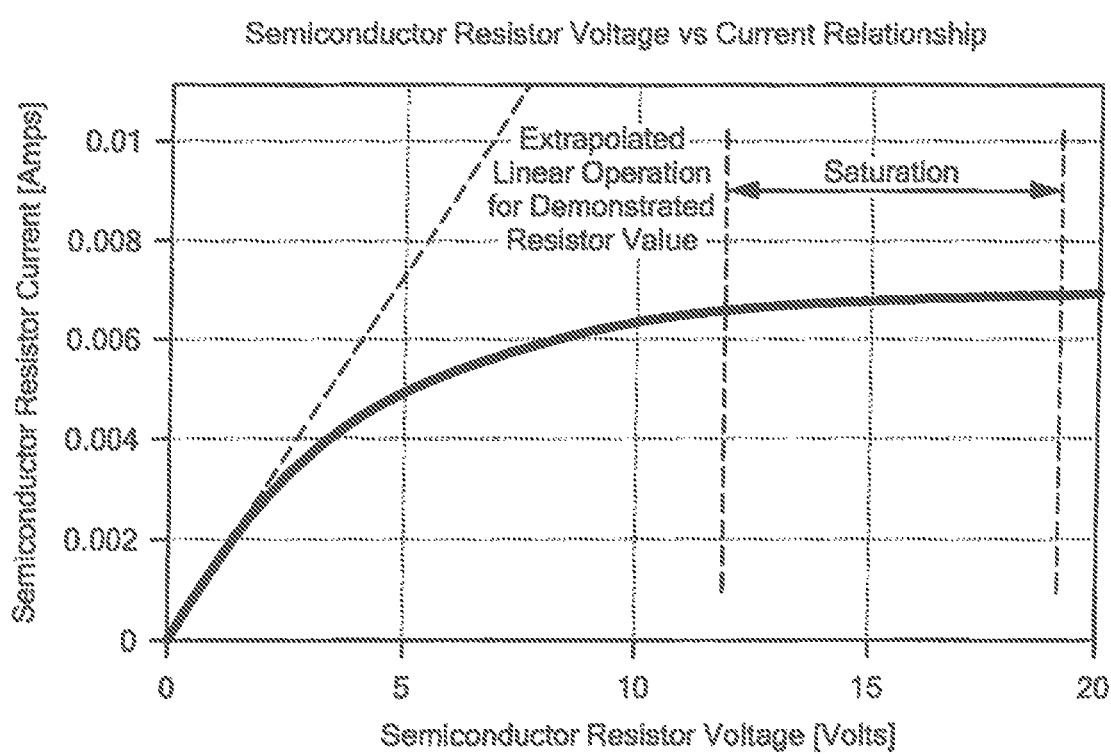
FIG. 4 is a curve showing the relationship between current and voltage of a semiconductor resistor.
Figure 6:
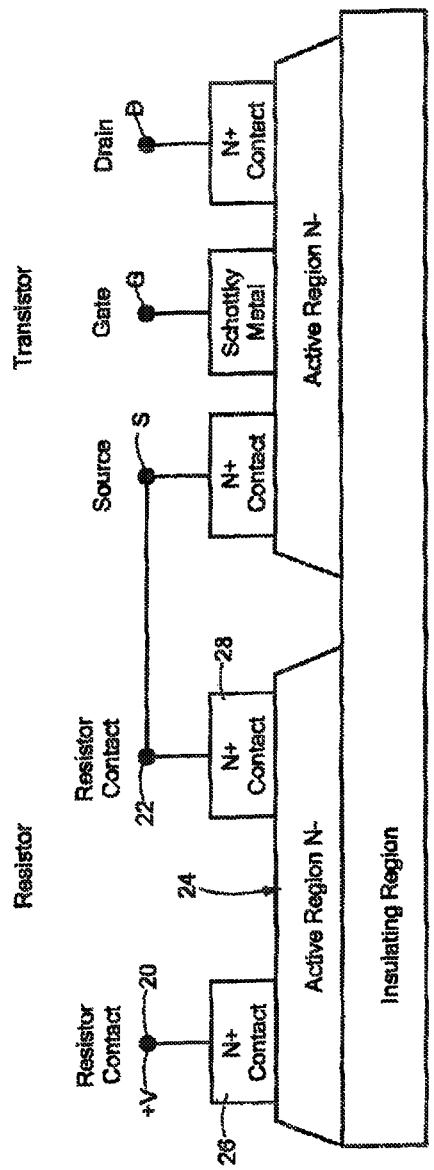
FIG. 6 is a simplified, diagrammatical cross section view of the resistor and one of the transistors used in the amplifier of FIG. 5.

It is noted that with such an arrangement, a current mirror circuit 14 is provided which produces a current ID2 into the drain electrode of FET Q2 proportional to the reference current Iref produced by the resistor R. The resistor R, shown in FIG. 5, includes a pair of spaced electrodes 20, 22 in ohmic contact with the semiconductor 12. The circuitry shown in FIG. 5 has sufficient voltage supplied to node 20 to place the resistor R into saturation (i.e., into the saturation region shown in FIG. 4) thereby producing a constant current (i.e., a current invariant with the voltage VDD connected to the resistor R) through a region 24 (FIG. 6) in the semiconductor 12 between the pair of spaced ohmic contacts 20, 22 with such produced constant current providing the reference current Iref for the current mirror circuit 14. The ohmic contacts 20, 22 in ohmic contact with doped regions 26, 28, respectively, in the semiconductor 12 and the region 24 in the semiconductor 12 between the doped regions 26, 28 is doped less than the ohmic contact doped regions. Here, the doped regions 26 and 28 are N+ and the region 24 is N−. The VDD must be sufficient to place FETs Q1 and Q2 in saturation and with such voltage VDD the size of R must be selected so that it is in saturation. Thus, FETs Q1 and Q2 along with resistor R are all in saturation during normal operation of the current mirror.

A number of embodiments of the disclosure have been described. Nevertheless, it will be understood that various modifications may be made without departing from the spirit and scope of the disclosure. For example, the saturated resistor to provide a reference current for a current mirror may be used in current mirrors formed with other types of FETs and/or with bipolar transistors. Further, while the saturated semiconductor resistor R has been described as using depletion-mode transistors, enhancement-mode transistors may be used in which case the gate electrode (G) of enhancement-mode FET Q2 would be connected to a positive potential. Accordingly, other embodiments are within the scope of the following claims.

What is claimed is:

1. A current mirror circuit, comprising:
a semiconductor having formed therein:
a pair of transistors arranged to produce an output current through an output one of the transistors proportional to a reference current fed to an input one of the pair of transistors;
a resistor comprising a pair of spaced electrodes in ohmic contact with the semiconductor, one of such pair of electrodes of the resistor being coupled to the input one of the pair of transistors;
circuitry for producing a voltage across the pair of electrodes of the resistor to place the resistor into saturation producing a current through a region in the semiconductor between the pair of spaced ohmic contacts, such produced current being fed to the input one of the transistors as the reference current for the current mirror;
wherein the ohmic contacts are doped regions in the semiconductor and wherein the region in the semiconductor between the doped regions is doped less than the ohmic contact doped regions.

2. The current mirror circuit recited in claim 1 wherein the circuitry places the pair of transistors into saturation along with placing the resistor into saturation.

3. The current mirror circuit recited in claim 1 wherein voltage also places the input one of the pair of transistors into saturation.

4. An amplifier circuit, comprising:
a semiconductor having formed therein:
current mirror circuitry comprising:
a field effect transistor having: a gate electrode; a source electrode and a drain electrode, the gate electrode being coupled to a potential different from ground potential the source electrode being coupled to ground potential; and the gate electrode being coupled to a variable input signal, the input signal being amplified by the transistor to produce an amplified signal at the drain electrode;
wherein the current mirror sets the current to the drain electrode proportional to a reference current produced by the current mirror, the current mirror comprising:
a resistor comprising a pair of spaced electrodes in ohmic contact with the semiconductor; and
circuitry for producing a voltage across the pair of electrodes of the resistor, such circuitry placing the resistor into saturation, such produced current being fed to drain electrode to provide the reference current;
wherein the ohmic contacts are doped regions in the semiconductor and wherein the region in the semiconductor between the doped regions is doped less than the ohmic contact doped regions.

5. The amplifier circuit recited in claim 4 wherein the pair of transistors are in saturation.

6. The amplifier circuit recited in claim 5 wherein the ohmic contacts are doped regions in the semiconductor and wherein the region in the semiconductor between the doped regions is doped less than the ohmic contact doped regions.

7. The amplifier circuit recited in claim 4 wherein the field effect transistor is a depletion-mode field effect transistor.

8. The amplifier circuit recited in claim 4 wherein the field effect transistor is a depletion-mode transistor and the gate electrode is coupled to a negative potential.

9. The amplifier circuit recited in claim 4 wherein the field effect transistor is an enhancement-mode transistor and the gate electrode is coupled to a positive potential.

* * * * *